United States Patent
Yamamoto et al.

(10) Patent No.: US 11,073,587 B2
(45) Date of Patent: Jul. 27, 2021

(54) NUCLEAR MAGNETIC RESONANCE APPARATUS AND BODY MOTION CORRECTION METHOD

(71) Applicant: Hitachi, Ltd., Tokyo (JP)

(72) Inventors: Yukari Yamamoto, Tokyo (JP); Toru Shirai, Tokyo (JP); Masahiro Takizawa, Tokyo (JP); Takashi Nishihara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/798,468

(22) Filed: Feb. 24, 2020

(65) Prior Publication Data
US 2020/0271744 A1  Aug. 27, 2020

(30) Foreign Application Priority Data

Feb. 25, 2019  (JP) .............................. JP2019-031754

(51) Int. Cl.
*G01R 33/565* (2006.01)
*G01R 33/56* (2006.01)

(52) U.S. Cl.
CPC ... *G01R 33/56509* (2013.01); *G01R 33/5608* (2013.01)

(58) Field of Classification Search
USPC ........................................................ 324/309
See application file for complete search history.

(56) References Cited

U.S. PATENT DOCUMENTS

| 2011/0311158 A1 | 12/2011 | Griswold et al. |
| 2015/0084628 A1* | 3/2015 | Sato ..................... G01R 33/243 324/309 |

* cited by examiner

*Primary Examiner* — Rodney E Fuller
(74) *Attorney, Agent, or Firm* — Mattingly & Malur, PC

(57) ABSTRACT

An image corrected for body motion with high accuracy in a short time when performing retrospective body motion correction on an MRI image is provided, and the time from imaging to image display is reduced. A body motion corrector of an MRI apparatus has a weighting factor calculator that calculates a three-dimensional weighting factor based on signals received by multi-channel receive coils. A processing space converter converts three-dimensional frequency space data of a measurement signal and the three-dimensional weighting factor respectively into hybrid space data and a two-dimensional weighting factor. A synthesized signal calculator calculates a synthesized signal by convolution integration of the hybrid space data and the two-dimensional weighting factor; and a body motion position detector detects a body motion occurrence position in the hybrid space from the hybrid space data and the synthesized signal.

17 Claims, 15 Drawing Sheets

Fig. 9

| METHOD | WEIGHTING FACTOR SIZE | NCC | RMSE | CALCULATION TIME (Sec) |
|---|---|---|---|---|
| CONVENTIONAL METHOD |  | 0.9948 | 0.1014 | 95.15 |
| EXAMPLE 1 | [5.3.1] | 0.9949 | 0.1009 | 59.54 |
| EXAMPLE 2 | [5.3.3] | 0.9945 | 0.1078 | 81.73 |

NUCLEAR MAGNETIC RESONANCE APPARATUS AND BODY MOTION CORRECTION METHOD

INCORPORATION BY REFERENCE

The present application claims priority from Japanese patent application JP-2019-31754 filed on Feb. 25, 2019, the content of which is hereby incorporated by reference into this application.

BACKGROUND OF THE INVENTION

Field of the Invention

The present invention relates to a nuclear magnetic resonance apparatus, and particularly to a technique for correcting influence of a motion (body motion) of an inspection object on a measurement signal during measurement using the nuclear magnetic resonance apparatus.

Background Art

The nuclear magnetic resonance apparatus is an apparatus that generates nuclear spins of atoms included in the inspection object placed in a static magnetic field to generate nuclear magnetic resonance, collects nuclear magnetic resonance signals generated from the inspection object, and obtains internal information of the inspection object. The nuclear magnetic resonance apparatus is used in medical imaging apparatuses such as a magnetic resonance imaging apparatus (an MRI apparatus).

Since the MRI apparatus requires a relatively long time to collect the signals necessary for creating an image, the motion (body motion) of the inspection object is easily caused during signal measurement, and there is a problem that the motion degrades quality of the image. With development of high-speed imaging methods such as parallel imaging using a plurality of receive coils, the influence of the motion over time are being reduced, however, since MRI examination is mainly intended for a living body such as a human, the body motion cannot be eliminated and the influence on the image is inevitable.

As described above, body motion correction in the MRI apparatus has been a long-standing problem, and various body motion correction methods have been proposed. For example, for periodic body motion, there are techniques for reducing the influence of the body motion during imaging, such as synchronous imaging and a method of controlling a gradient pulse in a direction in which the body motion is likely to occur. However, these methods are effective for the body motion that can be predicted to some extent, such as periodic body motion, but cannot cope with unpredictable body motion, and there is a limitation on signal acquisition timing and there is also a problem that measurement time is longer. On the other hand, various methods for retroactively correcting the influence of the body motion (retrospective correction) have also been proposed. For example, U.S. Patent Application Publication No. 2011-0311158 proposes a method in which a duplicate signal of the measurement signal is created by using an algorithm called GRAPPA (Generalized Auto-Calibrating Partially Parallel Acquisition), a body motion position in the measurement signal is detected using a difference between the measurement signal and the duplicate signal, and the body motion correction is performed. The GRAPPA is an algorithm for interpolating a missing portion of measurement space (frequency space) data in parallel imaging in which undersampling is performed using the plurality of receive coils. Unmeasured data is calculated by convolving data in a central region of the measurement space measured without thinning and a plurality of measurement signals. In U.S. Patent Application Publication No. 2011-0311158, the GRAPPA is used to calculate the duplicate signal from the measurement signal.

SUMMARY OF THE INVENTION

Specifically, U.S. Patent Application Publication No. 2011-0311158 discloses an example in which the body motion correction is performed on two-dimensional measurement space data. When this is applied to three-dimensional measurement data, for example, in the case of multi-slice data, calculation for all slices is required, and it takes a considerable amount of time to display after capturing the image. Further, in the case of data obtained by 3D measurement, a three-dimensional weighting factor (kernel) is required, and it takes a longtime for convolution operation of the measurement data with the kernel.

An object of the present invention is to provide an image where influence of the body motion is corrected with high accuracy in a short time when performing retrospective body motion correction, and to reduce a time from imaging to image display.

The present invention generates a synthesized signal that is not affected by the body motion from the measurement data, and detects a body motion occurrence position using the synthesized signal, in order to detect the body motion occurrence position in the measurement data in a three-dimensional frequency space. In generating the synthesized signal, the weighting factor obtained from three-dimensional frequency space data, and the three-dimensional frequency space data to be corrected are converted into hybrid space data, and the convolution operation is performed. Thus, a time required for time-consuming convolution operation is reduced, and the measurement data corrected for the body motion is obtained in a short time.

That is, the nuclear magnetic resonance apparatus of the present invention is a nuclear magnetic resonance apparatus that generates nuclear magnetic resonance in an inspection object and measures a nuclear magnetic resonance signal, including: a receive coil that receives the nuclear magnetic resonance signal; an image reconstructor that reconstructs an image using a measurement signal received by the receive coil; and a body motion corrector that corrects influence of a motion of the inspection object generated in the measurement signal. The body motion corrector includes: a weighting factor calculator that calculates a three-dimensional weighting factor based on signals received by multi-channel receive coils constituting the receive coil; a processing space converter that converts three-dimensional frequency space data of the measurement signal and the three-dimensional weighting factor respectively into hybrid space data and a two-dimensional weighting factor; a synthesized signal calculator that calculates a synthesized signal by convolution integration of the hybrid space data and the two-dimensional weighting factor; and a body motion position detector that detects a body motion occurrence position in the hybrid space from the hybrid space data and the synthesized signal.

In the nuclear magnetic resonance apparatus of the present invention, the body motion corrector may further include a signal replacer that replaces a signal of the body motion occurrence position detected by the body motion position detector with a signal value at a position corresponding to the synthesized signal, or zero, to correct the signal. The image reconstructor generates the image using the measurement signal corrected by the signal replacer.

Further, the nuclear magnetic resonance apparatus of the present invention can include a user interface unit that receives a condition on body motion correction.

According to the present invention, it is possible to significantly reduce a calculation time of body motion detection by performing processing space conversion between a processing space for calculating the three-dimensional frequency space of the measurement signal to be corrected for the body motion and the three-dimensional weighting factor, and a processing space for performing the convolution operation using the weighting factor. Thus, the time from imaging to display of a corrected image can be reduced, and a user can quickly determine whether the user needs to retake the image. Further, since the weighting factor used in the convolution operation is obtained by converting the weighting factor calculated as the same three-dimensional data as the three-dimensional frequency space data to be processed, a highly accurate synthesized signal can be obtained. This makes it possible to maintain accuracy of body motion position detection based on the synthesized signal, and eventually accuracy of the body motion correction based on the detected position.

BRIEF DESCRIPTION OF THE DRAWINGS

FIG. 9 is a table showing a comparison between effects of a body motion correction method of the first embodiment and effects of a conventional method;

DESCRIPTION OF THE PREFERRED EMBODIMENTS

Figure 1:
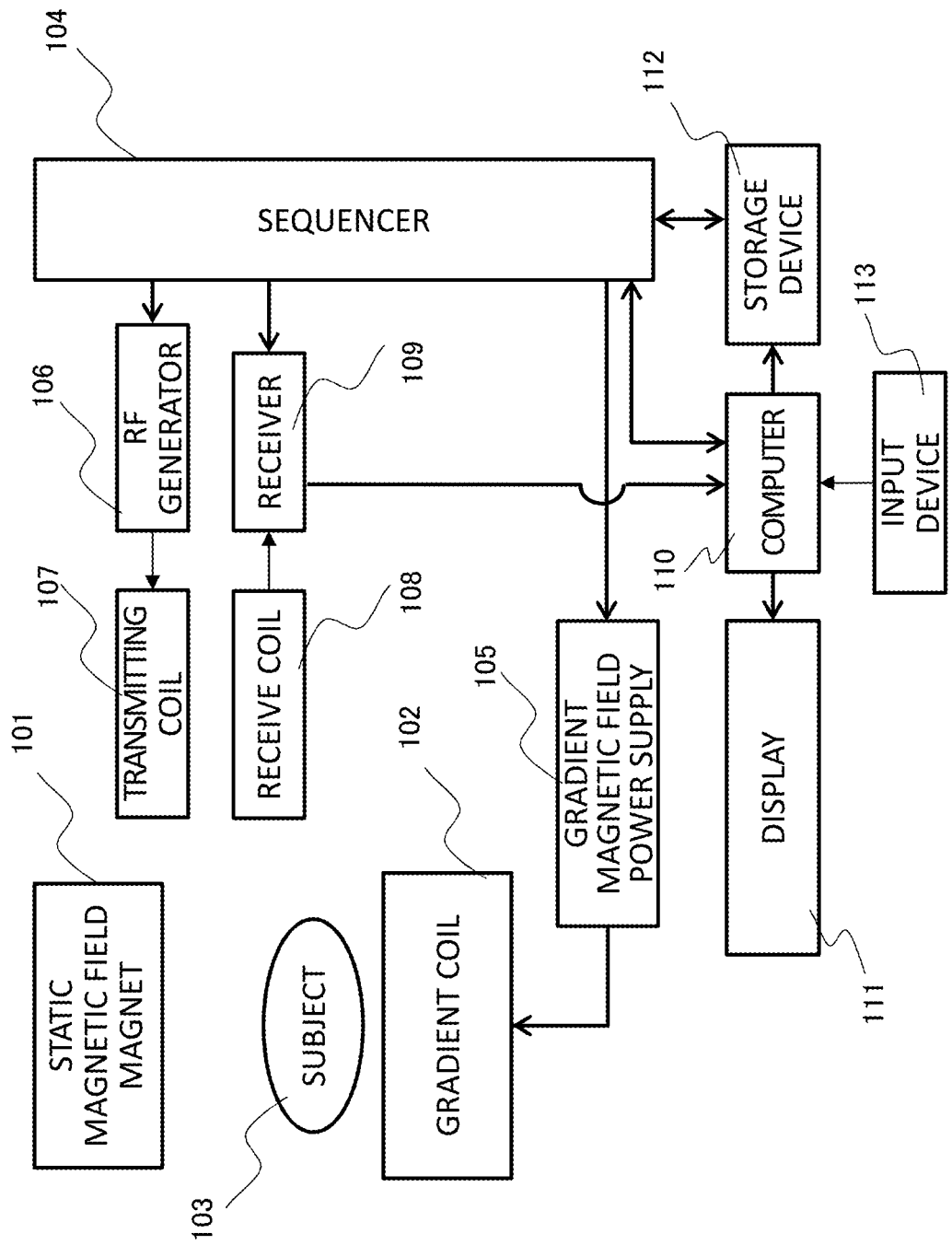
FIG. 1 is a diagram illustrating an overall outline of an MRI apparatus.

Hereinafter, an embodiment of a nuclear magnetic resonance apparatus of the present invention will be described with an MRI apparatus as an example. FIG. 1 is a diagram illustrating an overall outline of a typical MRI apparatus. An MRI apparatus 100 is roughly divided into an imaging system and a signal processing/control system. The imaging system includes a static magnetic field magnet 101 that generates a static magnetic field in a space where a subject 103 is placed, a gradient coil 102 for generating a gradient magnetic field in the static magnetic field generated by the static magnetic field magnet 101, a gradient magnetic field power supply 105 that drives the gradient coil 102, a transmitting coil 107 that irradiates a high frequency magnetic field, an RF generator 106 that generates a high frequency signal for driving the transmitting coil 107, a receive coil 108 that detects an NMR signal, a receiver 109, and a sequencer 104. The signal processing/control system includes a computer 110, a display 111, a storage device 112, and an input device 113.

The receive coil 108 includes, for example, a multi-channel coil such as a multi-array coil in which multi-channel receive coils are arranged, and each channel is connected to the receiver 109.

The subject 103 is a living body and is placed on a bed (not shown) in a static magnetic field space generated by the static magnetic field magnet 101. The sequencer 104 sends a command to the gradient magnetic field power supply 105, the RF generator 106, and the receiver 109, and controls each device to operate at a timing and an intensity programmed in advance. Specifically, the sequencer 104 sends the command to the gradient magnetic field power supply 105 and the RF generator 106, to generate the gradient magnetic field and the high-frequency magnetic field respectively from the gradient coil 102 and the transmitting coil 107. Further, the sequencer 104 controls to receive the NMR signal generated from the subject 103 and received by the receive coil 108 for a predetermined sampling time.

A program for operating the sequencer 104 is called a pulse sequence, and various programs are stored in a memory of the computer 110 or the storage device 112 depending on an imaging method. When the type of pulse sequence and imaging conditions (imaging parameters) set by a user through the input device 113 are determined, an imaging pulse sequence that is the program for operating the sequencer 104 is determined. Although any pulse sequence can be used in the MRI apparatus of the present embodiment, a pulse sequence for collecting three-dimensional frequency space data (hereinafter, referred to as 3D-k space data) is performed.

The computer 110 includes the memory and a processor such as a CPU or a GPU, controls operation of an entire apparatus (a function as the control system), processes the NMR signal sent from the receiver 109, and performs operations such as image reconstruction and signal correction (a function as the signal processing system). Information such as parameters necessary for the operations is input from an input device 113 connected to the computer 110. A result of signal processing performed by the computer 110 is displayed on the display 111. If necessary, the storage device 112 can store the signal, a calculation result, measurement conditions, and the like.

Figure 2:
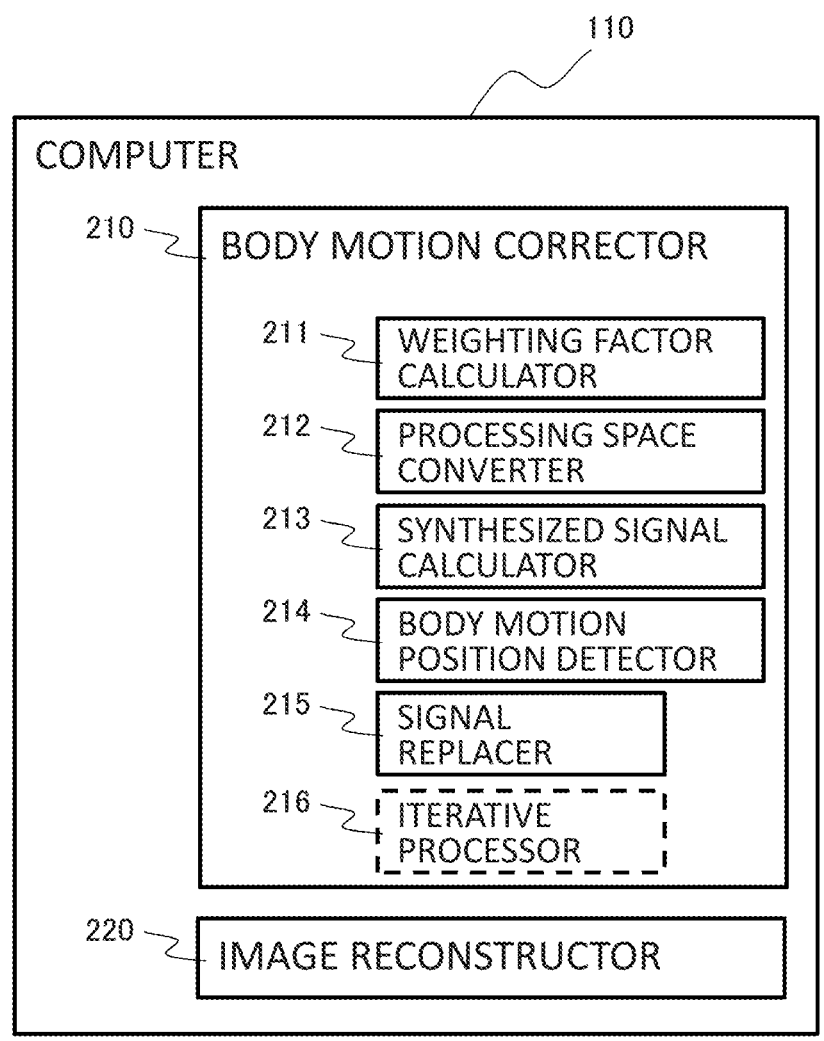
FIG. 2 is a functional block diagram of a signal processing system of a computer.

FIG. 2 is a functional block diagram of the signal processing system of the computer 110. As shown in the drawing, the signal processing system includes an image reconstructor 220 that performs an operation such as Fourier transform using a nuclear magnetic resonance signal to generate an image of an inspection object, and a corrector that performs a process such as correction on the nuclear magnetic resonance signal, or image data generated by the image reconstructor 220. In the present embodiment, the corrector includes a body motion corrector 210 that detects a position where a motion of the inspection object occurs in the nuclear magnetic resonance signal, and corrects the signal at the detected position. Although the corrector may have a function other than the body motion corrector 210, only the body motion corrector 210 is shown here.

The body motion corrector 210 includes a weighting factor calculator 211, a processing space converter 212, a synthesized signal calculator 213, a body motion position detector 214, and a signal replacer 215. The body motion corrector 210 detects a position (position in the space) of the motion (body motion) of the subject 103 occurring during signal collection in the three-dimensional frequency space data including the NMR signal collected by the imaging system, and corrects the signal at the position. The body motion corrector 210 may include an iterative processor 216 and the like when repeating the process. The function of each unit included in the body motion corrector 210 will be described in detail in an embodiment below. In the embodiment of FIGS. 1 and 2, the process of the body motion corrector 210 is performed by the computer 110, however, it is also possible to perform a part of the process of the body motion corrector 210 by means other than the computer 110, for example, hardware such as an ASIC, an FPGA or the like.

Hereinafter, an embodiment of the process in the MRI apparatus of the present embodiment including body motion correction will be described.

First Embodiment

In the present embodiment, a 3D weighting factor (hereinafter, referred to as a 3D kernel) is calculated using data obtained by fully sampling 3D-k space, and the synthesized signal (hybrid space data) is generated by convolution operation of the 3D-k space data (measurement data) with the 3D kernel in a hybrid space. Further, the body motion position in the measurement data is detected from a difference between the measurement data (hybrid measurement data) and the synthesized signal, in the hybrid space.

Figure 3:
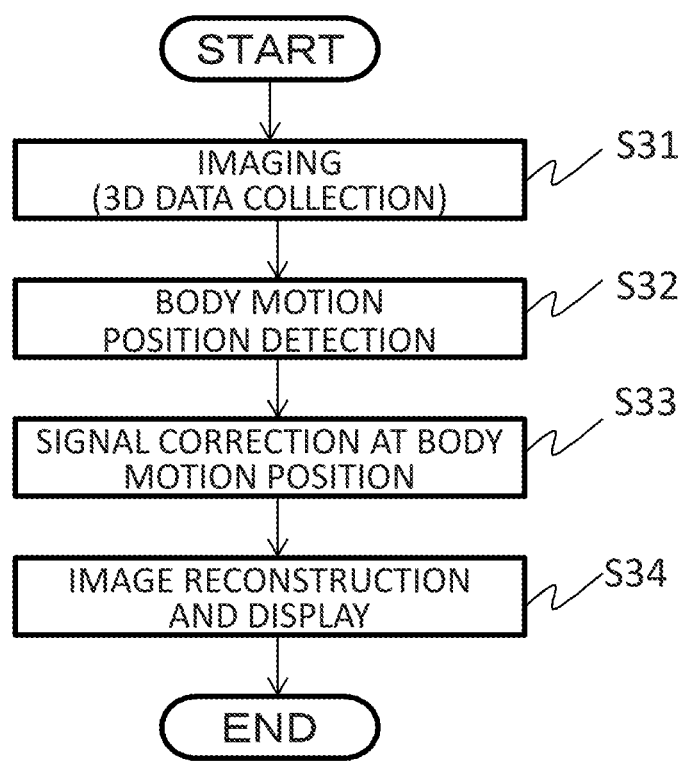
FIG. 3 is a diagram illustrating a processing procedure of imaging and body motion correction in the MRI apparatus of a first embodiment.

FIG. 3 shows an outline of the process in the present embodiment. First, the imaging system is driven to collect the 3D-k space (S31). Next, the body motion corrector 210 detects the position where the body motion has occurred in the measurement signal (S32), and corrects the signal at the position (S33). Thereafter, an image of the subject is reconstructed using the corrected measurement signal, and is displayed on the display 111 (S34).

Hereinafter, contents of each process will be described in detail.

Imaging Step: S31

A known pulse sequence for obtaining a three-dimensional image data is performed. As the pulse sequence for obtaining the three-dimensional image data, there has been known a multi-slice sequence in which a 2D pulse sequence for exciting a predetermined slice (cross-section) and obtaining a signal from the slice is performed for a plurality of slices, and a 3D pulse sequence in which a predetermined volume is excited at once, and a signal is obtained from the volume, but any of them may be employed. Further, any of a spin echo system and a gradient echo system may be used. However, a body motion correction process described below targets data in the 3D-k space.

Figure 4:
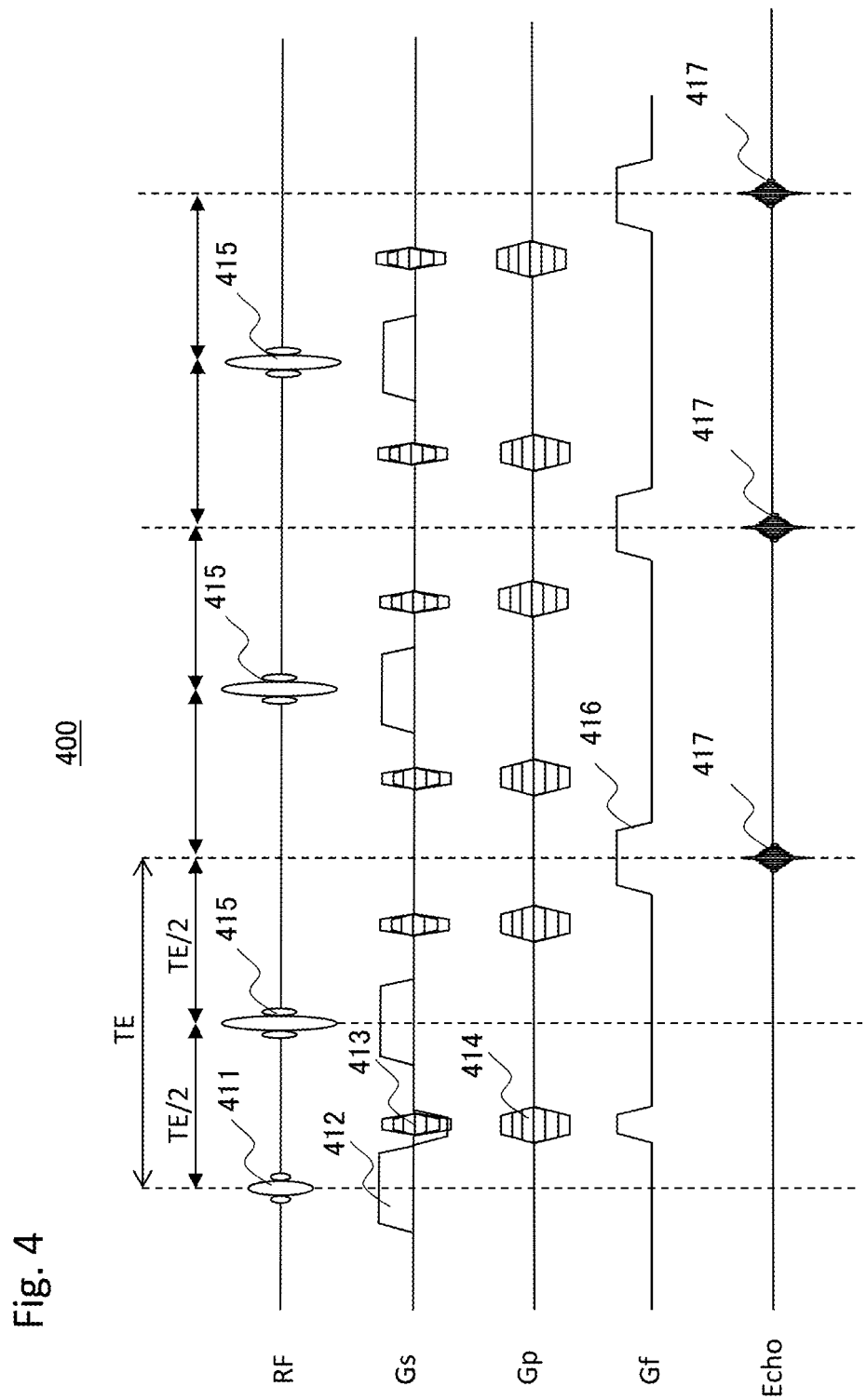
FIG. 4 is a diagram illustrating an example of a 3D pulse sequence used in the MRI apparatus of the first embodiment.

FIG. 4 shows an example of the 3D pulse sequence. In FIG. 4, RF, Gs, Gp, and Gf respectively represent the high-frequency magnetic field, a slice gradient magnetic field, a phase encoding gradient magnetic field, and a frequency encoding gradient magnetic field. A horizontal axis is time. A pulse sequence 400 is a pulse sequence (an FSE sequence) of the spin echo system, and irradiates an RF pulse 411 for excitation simultaneously with a slice selection gradient pulse 412, to excite a spin of a specific slice of the subject 103. Subsequently, the subject is applied with phase encoding gradient magnetic fields 413 and 414 for phase encoding an echo signal, and is irradiated with an RF pulse 415 for inverting the spin. Thereafter, after a time TE from irradiation of the RF pulse 411, the subject is applied with a readout gradient magnetic field 416, to measure an echo signal 417. Thereafter, while changing an application amount of the phase encoding gradient magnetic fields 413 and 414, the subject is repeatedly applied with the inversion RF pulse 415 at an interval TE, and the echo signal 417 is measured at TE/2 from the inversion RF pulse 415. A trajectory of the k-space differs depending on how to change the application amount of the phase encoding gradient magnetic fields 413 and 414 (a scanning method), but is not particularly limited in the present embodiment. Further, all signals of one phase encode may be collected by one excitation, or may be measured in plural times. Finally, the echo signal is measured until all the desired k-space regions set in advance are filled.

Each echo signal obtained by such a 3D pulse sequence is disposed in a position corresponding to the sampling time, a phase encoding amount and a slice encoding amount when the echo signal is obtained in the 3D-k space (kx, ky, kz) having axes in a frequency encoding direction, a phase encoding direction and a slice encoding direction. Such 3D-k space data is obtained for each small RF receive coil (channel) constituting the receive coil 108.

Body Motion Position Detection Step: S32

In general, the sampling time of the echo signal is extremely short, and one-line data in the phase encoding direction is hardly affected by the motion (body motion) of the subject. However, since there is an echo time and a time difference between repetitions TR of the pulse sequence in adjacent phase encodes and adjacent slice encodes, the motion (body motion) of the subject may occur during that time, and in that case, the data is affected by the body motion. In the present step S32, a line (for example, a line in the phase encoding direction) of such a body motion occurring is detected.

Details of the body motion position detection step S32 will be described with reference to FIG. 5.

First, the kernel calculator 211 calculates a three-dimensional weighting factor (3D-kernel) used to generate the synthesized signal from the 3D-k space data (S501). The 3D-kernel can be calculated as follows using data (reference data) near a k-space center of the 3D-k space data received by the receive coil of each channel.

For example, when a signal at a certain position r(i, j, k) in the 3D-k space data received by the RF receive coil of one channel is Sr, and a signal received by the RF receive coil of each channel in a region of a predetermined size centered on Sr is A(r, m) (m is a number for identifying an RF coil channel) (excluding Sr), a synthesized signal Srg of A(r, m) obtained by convolution integration with a 3-D kernel β of a predetermined size can be expressed by the following equation (1).

$$Srg = \Sigma_m \Sigma_r A(r,m)\beta \quad (1)$$

Using this equation, a weighting factor β that minimizes a difference between Srg and A(r, m) is calculated by the following equation (2) by the least square method.

$$\beta = (A^H A)^{-1} A^H Srg \quad (2)$$

In the equation, bold Srg, A, and β are matrices.

If the size of the 3D-kernel is too large in the direction (slice encoding direction) in which a one-dimensional Fourier transform is performed, effect of reducing motion artifact deteriorates due to influence of high-frequency components, and thus the size of the 3D-kernel in the slice encoding direction (the direction in which a matrix size of the 3D-k space data is minimized) is set to be 10% or less of the size of the 3D-k space data in the same direction. As an example, when f is a size in the frequency encoding direction, p is a size in the phase encoding direction, and s is a size in the slice encoding direction, [f, p, s] is [5, 3, 1], [5, 3, 3], [5, 3, 5], or the like.

A method for calculating the 3D-kernel β is not limited to the above-described method. For example, when the reference data is used, the kernel may be calculated after correcting the reference data in order to eliminate influence of the body motion when obtaining the reference data.

After calculating the 3D-kernel, the processing space converter 212 performs the one-dimensional Fourier transform on the 3D-k space data (kx, ky, kz) received by the small RF receive coil in a predetermined direction (z direction), to obtain hybrid space data (kx, ky, z) (S502). It is preferred that the direction in which the one-dimensional Fourier transform is performed is the direction in which the matrix size of the 3D-k space data is minimized. Here, the z direction is the slice encoding direction.

Figure 6:
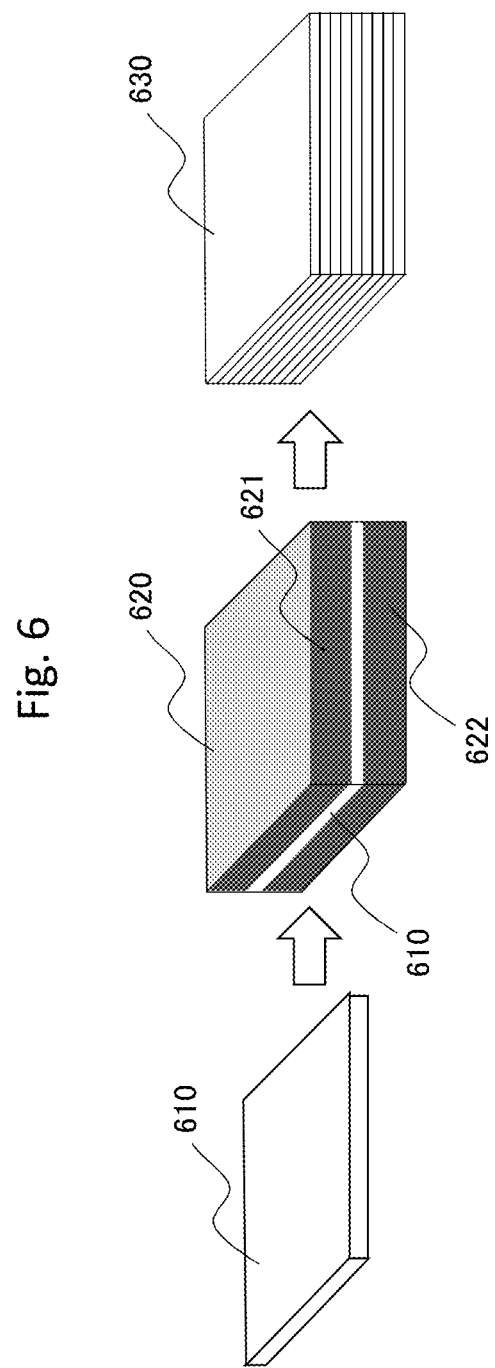
FIG. 6 is a view for explaining processing space conversion for a weighting factor (kernel)

Further, the processing space converter 212 converts the 3D-kernel into a 2D-kernel (two-dimensional weighting factor) (S503). An example of a method for converting the 3D-kernel into the 2D-kernel will be described with reference to FIG. 6. Since a size of a 3D-kernel 610 calculated in Step S501 is calculated using data in a narrow area including a center of the k-space, a size in a kz direction is, for example, small as shown at a left end of FIG. 6. The 3D-kernel 610 is zero-filled in the kz direction (FIG. 6: center), and the size in the kz direction is set to a size corresponding to the matrix size of the 3D-k space data. This zero-filled 3D-kernel 620 is subjected to the one-dimensional Fourier transform to obtain a 2D-kernel 630 having a desired size.

Next, the synthesized signal calculator 213 performs convolution integration on measurement signals Sh(kx, ky, z) converted into the hybrid space with the 2D-kernel for each data at each z position by Equation (3), to generate a new synthesized signal (S504).

$$Sg = Sh \otimes B \quad (3)$$

In the equation, bold Sg, B, and Sh are matrices, and respectively represent the synthesized signal, the 2-D kernel, and the measurement signal.

Figure 7:
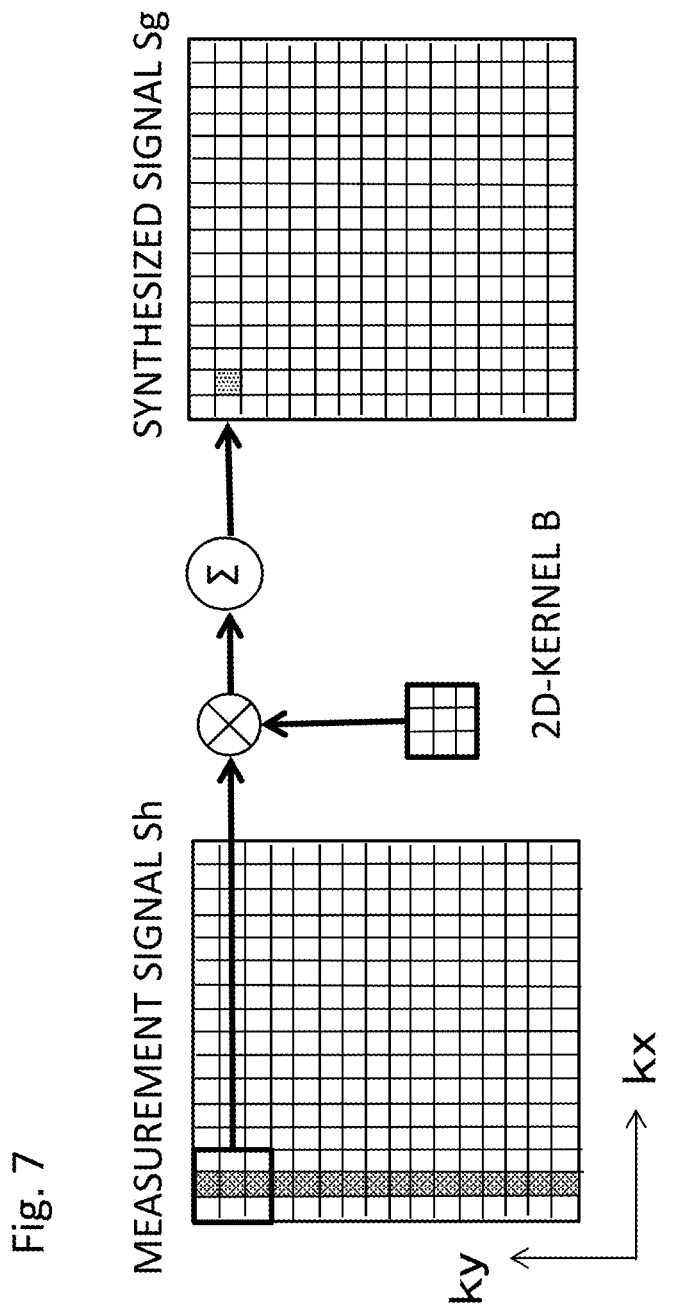
FIG. 7 is a diagram illustrating generation of a synthesized signal by a convolution operation.

Since this process is the convolution operation on the 2D-data, it can be performed in a shorter time than the convolution operation on the 3D-data. FIG. 7 shows a process of obtaining the synthesized signal from the measurement signal by the convolution integration. In the drawing, a line shown by a hatched line is a line in which the body motion has occurred during measurement. Since the signal on this line is synthesized using surrounding signal values that do not include the signal itself, the influence of the body motion is significantly reduced.

The process of steps S501 to S504 is performed on the 3D-k space data of each channel to obtain the synthesized signal for each channel (S505).

Next, the body motion position detector 214 detects the body motion position from a difference between a synthesized signal Sg in the hybrid space and the hybrid space data (kx, ky, z) of the measurement signal (S506). The synthesized signal Sg (kx, ky, z) is obtained by performing convolution integration on a plurality of signals with the kernel as described above, and is thus data with reduced influence of the body motion. Therefore, by taking the difference from the synthesized signal Sg, the influence of the body motion can be removed.

Specifically, for each slice, a differential signal between the synthesized signal and the measurement signal is projected on a phase encoding axis, to obtain a maximum value on a projection profile. A differential signal p can be obtained by the following equation (4).

$$\rho(k_x) = \sqrt{\Sigma_{k_y=1}^{N_y} \Sigma_{l=1}^{L} |S_g(k_x, k_y, l) - S(k_x, k_y, l)|^2} \quad (4)$$

Figure 8:
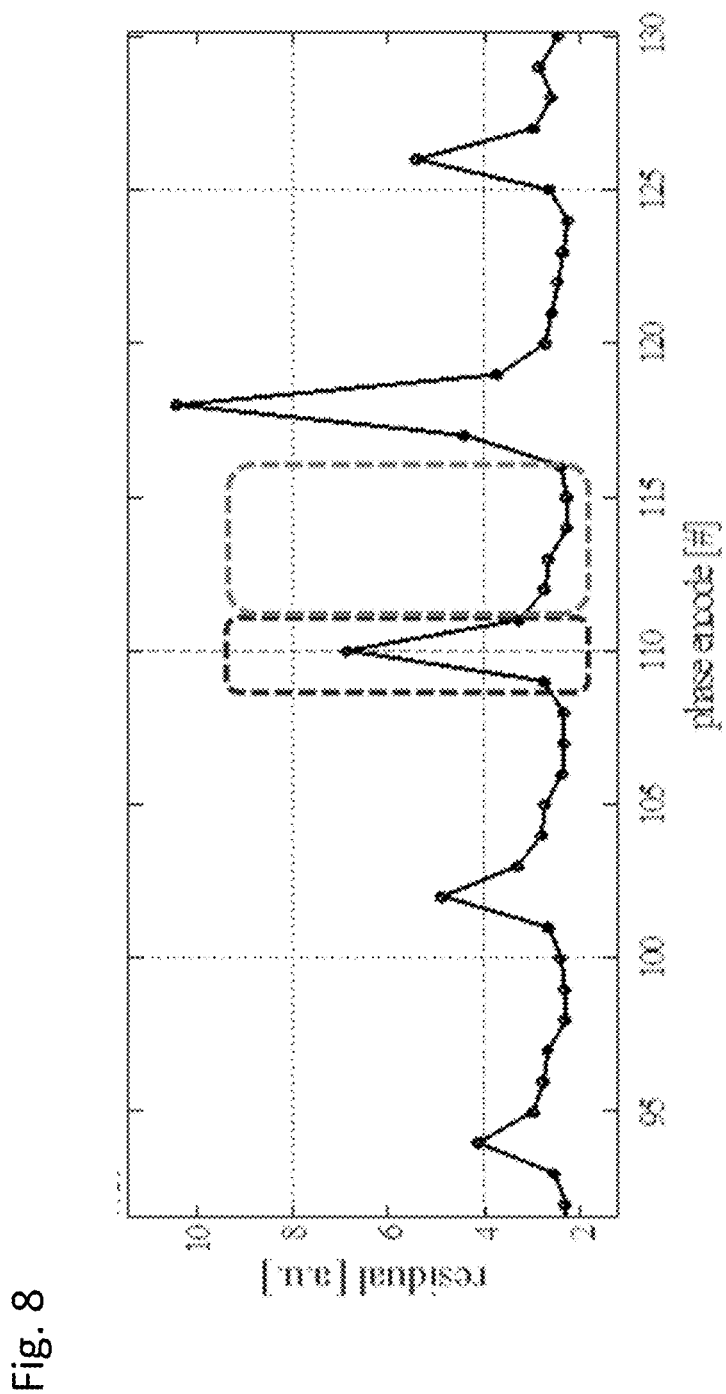
FIG. 8 is a diagram illustrating a profile of a differential signal used for the body motion position detection.

In Equation (4), l represents the channel of the receive coil, and ky represents a frequency encoding axis in the frequency space. FIG. 8 is a diagram showing an example of the projection profile obtained by projecting the differential signal on the phase encoding axis. In the drawing, the horizontal axis represents the phase encode, and the vertical axis represents an arbitrary unit representing an intensity of the differential signal. As shown in FIG. 8, a peak of the differential signal appears on the line in which the body motion has occurred. The body motion position detector 214 performs a local maximum value search on the projection profile of the differential signal. A known search method can be employed in the local maximum value search. However, since a signal intensity is different between at the center and an end in the k space or the hybrid space, the peak caused by the body motion is not determined using a uniform threshold value, but the maximum value in a local area (an area surrounded by a broken line) is determined, to detect a position determined to be the maximum value as the body motion position (S507). Prior to the local maximum value search, a filtering process such as a moving average filter or a wavelet filter may be performed on the projection profile.

In Step S506, the body motion position may be detected from the differential signal using the synthesized signal and the measurement signal obtained for each channel, or the body motion position may be detected by integrating the differential signal obtained for each channel.

With the above steps S501 to S507, the step S32 of FIG. 3 is completed.

S33, S34

In the body motion corrector 210, the signal replacer 215 finally replaces the signal (line data) at the body motion position (phase encoding position) detected with the signal that does not include the influence of body motion (S33). For example, a signal at a position corresponding to the synthesized signal calculated in the step S32 can be used as the signal that does not include the influence of body motion. Or, it may be replaced with zero.

The image reconstructor 220 forms 3D-image data by further performing the Fourier transform on the hybrid space data corrected for the body motion (S34).

As described above, according to the present embodiment, since the body motion position detection and the body motion correction are performed in a processing space with reduced dimensions for the 3D-frequency space in which the measurement signal and the 3D-weighting factor are calculated, a calculation speed can be increased while maintaining high accuracy of the body motion position detection. As a result, it is possible to reduce a time from measurement of the nuclear magnetic resonance signal to display of the image corrected for the body motion.

According to the present embodiment, a desired size can be obtained in space conversion of the 3D-weighting factor, and a kernel size can be easily optimized.

FIG. 9 shows a table in which effects of the body motion correction are compared between the conventional method (body motion using GRAPPA method) and the method of the present embodiment using the measurement data obtained by imaging a brain by an FSE method. The present embodiment shows two examples having different sizes of the weighting factors (kernels), that is, [5,3,1] (Example 1) and [5,3,3] (Example 2).

Effects of image quality improvement by the correction was confirmed by calculating similarity NCC (Normalized Cross-Correlation) and residual RMSE (Root Mean Squared Error) between the corrected image (Cor) and the image (reference image Ref) not including effects of the body motion, respectively by the following equations (5) and (6).

$$NCC = \frac{\sum_j \sum_i Cor(i, j) Ref(i, j)}{\sqrt{\sum_j \sum_i Cor(i, j)^2 \times \sum_j \sum_i Ref(i, j)^2}} \quad (5)$$

$$RMSE = \sqrt{\frac{\sum_j \sum_i (Cor(i, j) - Ref(i, j))^2}{\sum_j \sum_i (Ref(i, j))^2}} \quad (6)$$

As can be seen from the table, the method according to the present embodiment can significantly reduce a calculation time as compared with the conventional method, and can achieve the same image quality improvement effect as the conventional method. In Example 1, the RMSE was improved as compared with the conventional method. From a comparison between Example 1 and Example 2, it was found that the size of the weighting factor in the z direction (the direction in which the matrix size of the three-dimensional frequency space data is minimized) affects the image quality improvement effect.

Modification 1

In the first embodiment, in the imaging using the 3D-pulse sequence by the imaging unit, the scanning method of the echo signal (417 in FIG. 4) is not particularly limited, however, the accuracy of body motion position detection is improved by specifying the scanning method of the echo signal in the present Modification.

Figure 10:
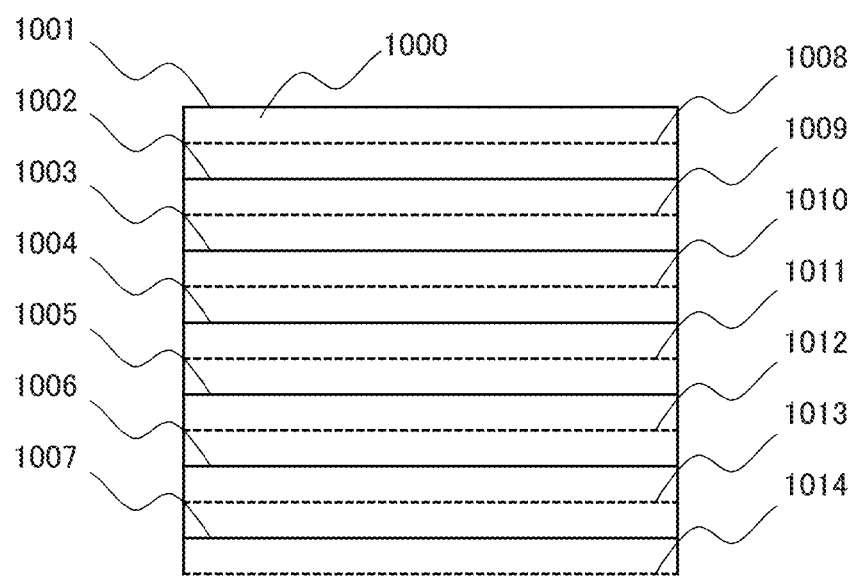
FIG. 10 is a diagram illustrating interleave measurement in Modification 1 of the first embodiment.

In the body motion correction process according to the first embodiment, when continuous phase encoding lines are affected by the body motion, the body motion position may be erroneously detected. In the present embodiment, in order to prevent the continuous phase encoding lines from being affected by the body motion, for example, interleave measurement is performed to collect the 3D-k space data. FIG. 10 is a diagram illustrating a method for scanning frequency measurement space data by the interleave measurement. In the interleave measurement, the phase encoding lines are divided into two or more, to alternately obtain the signals. For example, if the number of divisions is 2, odd-numbered phase encoding lines 1001, 1002, 1003, ——— are first scanned, and then even-numbered phase encoding lines 1008, 1009, 1010, ——— are scanned, to obtain a signal 1000 filling an entire k-space. After scanning the even-numbered phase encoding lines first, the odd-numbered phase encoding lines may be scanned.

The synthesized signal used for detecting the body motion position is obtained by convolution of the signals around the signal at the certain position using the weighting factor. By dispersing the phase encoding lines affected by the body motion by using the interleave measurement as described above, erroneous detection of the body motion position can be prevented even when the influence of the body motion continues over a measurement period for the phase encoding lines.

Modification 2

Figure 11:
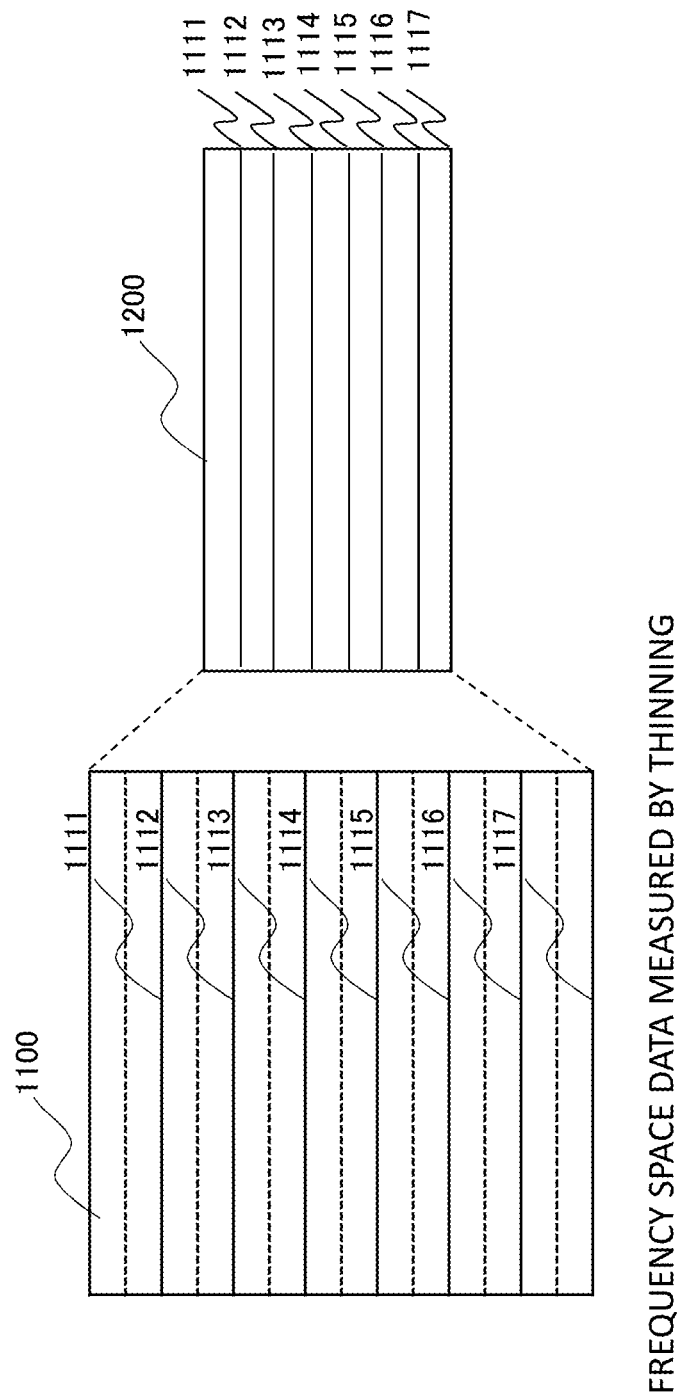
FIG. 11 is a diagram for explaining a process for undersampling data in Modification 2 of the first embodiment.

In the first embodiment, a case where the imaging unit measures the data of all points of the 3D-k space data (full sampling) has been described. However, the 3D-k space data may be measured, for example, by thinning (undersampling) the line data in the phase encoding direction. In this case, as shown in FIG. 11, the process by the body motion corrector 210 may be performed such that the size of undersampled 3D-k space data 1100 (measurement lines: 1111 to 1117) is set as the size excluding unmeasured lines. Except that, it may be performed in the same manner as in the first embodiment. In this case, the 3D-kernel is calculated using a full-sampling measurement signal different from the measurement signal to be corrected for the body motion, to calculate the synthesized signal, and detect the body motion position in the hybrid space. Or, the full sampling is performed only in a central region of the k space used for kernel calculation, and the 3D-kernel is calculated from the signals in this region, to calculate the synthesized signal and detect the body motion position in the hybrid space. Thus, undersampling data corrected for the body motion is obtained.

The image reconstructor 220 reconstructs the image in which aliasing is unfolded in the k space or in the reconstructed image space based on a known parallel imaging (PI) algorithm, for example, GRAPPA or SENSE. The 3D-kernel calculated at the time of the body motion correction is based on sensitivity information of the RF receive coil of each channel constituting the receive coil. Therefore, when a PI algorithm for estimating the unmeasured line in the k space by using the sensitivity information of the RF receive coil of each channel is employed, it is also possible to calculate the kernel or sensitivity distribution for the PI algorithm by using the data used for the 3D-kernel calculation for the body motion correction.

Second Embodiment

Figure 12:
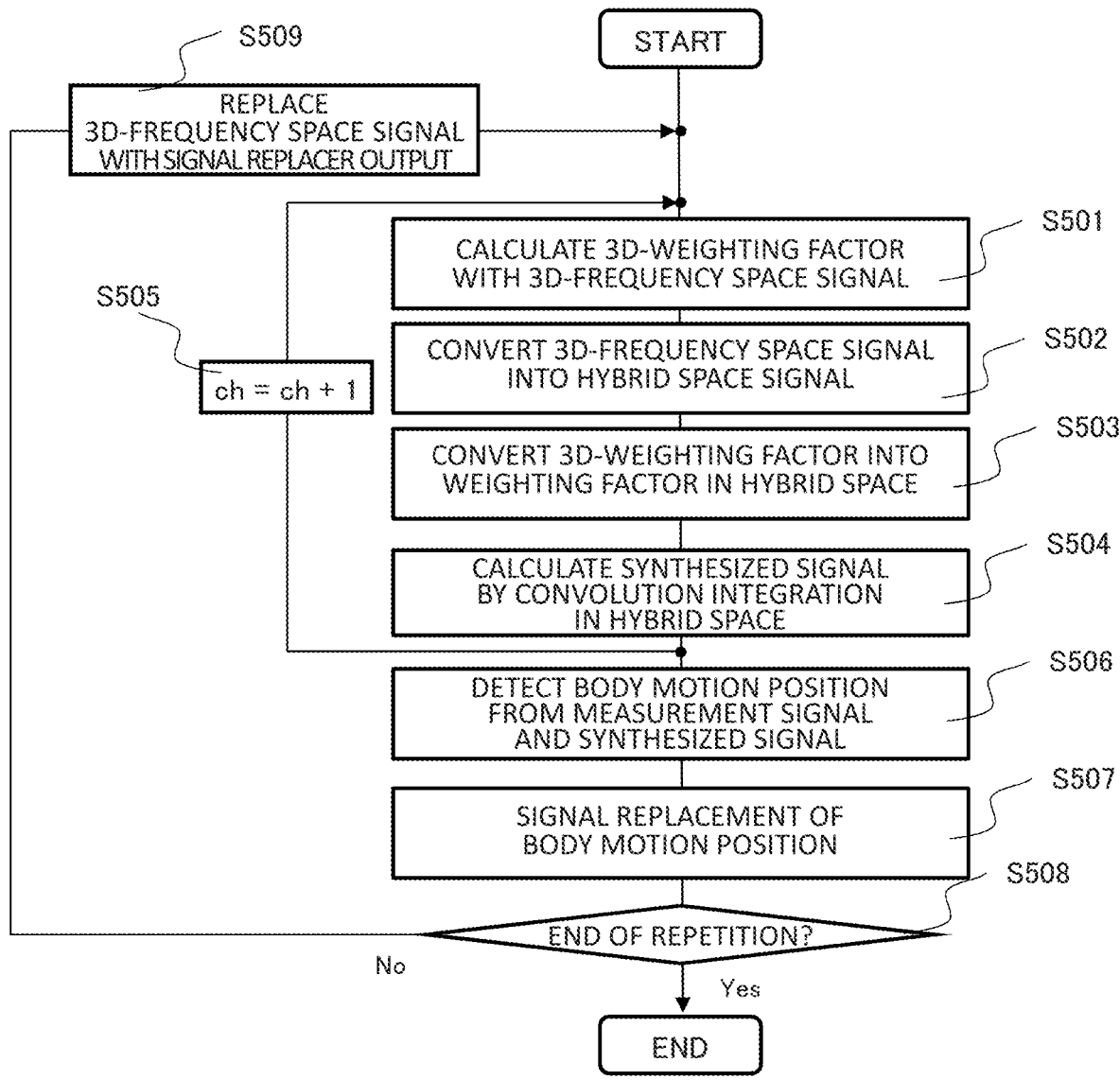
FIG. 12 is a diagram illustrating the processing procedure of the body motion position detection in the body motion corrector of a second embodiment.

The present embodiment is the same as the first embodiment in that the body motion position detection and the body motion correction are performed in the processing space different from the processing space in which the measurement signal and the 3D-weighting factor are calculated. However, the process (FIG. 5) in the body motion corrector is repeated in the present embodiment. In the present embodiment, the iterative processor 216 is added to the body motion corrector 210 shown in FIG. 2 as a functional unit. FIG. 12 shows a flow when the process is repeated. In FIG.

Figure 5:
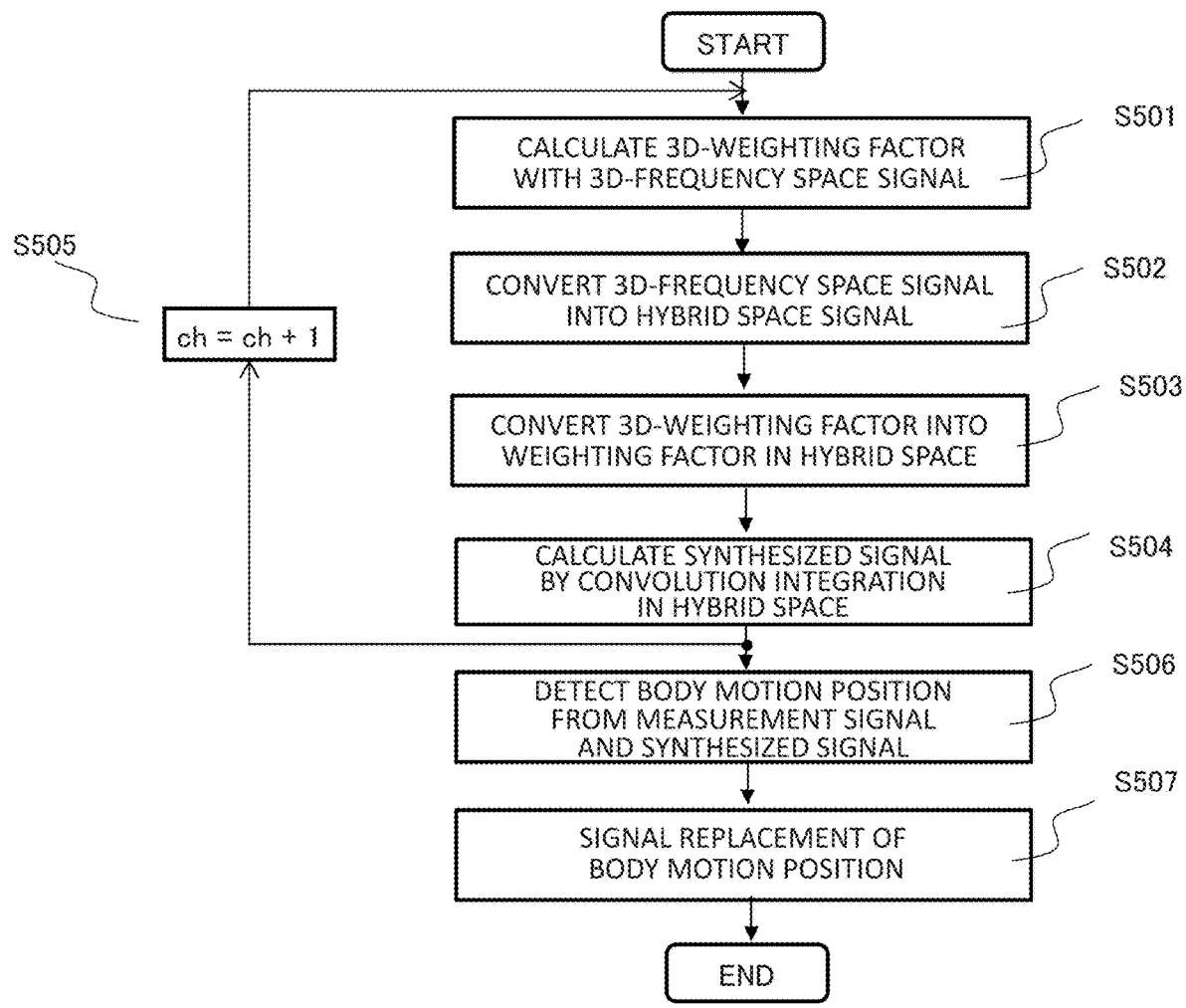
FIG. 5 is a diagram illustrating a processing procedure of body motion position detection in a body motion corrector of the first embodiment.

12, the same steps as those in FIG. 5 are denoted by the same reference numerals, and redundant description will be omitted.

Figure 14:
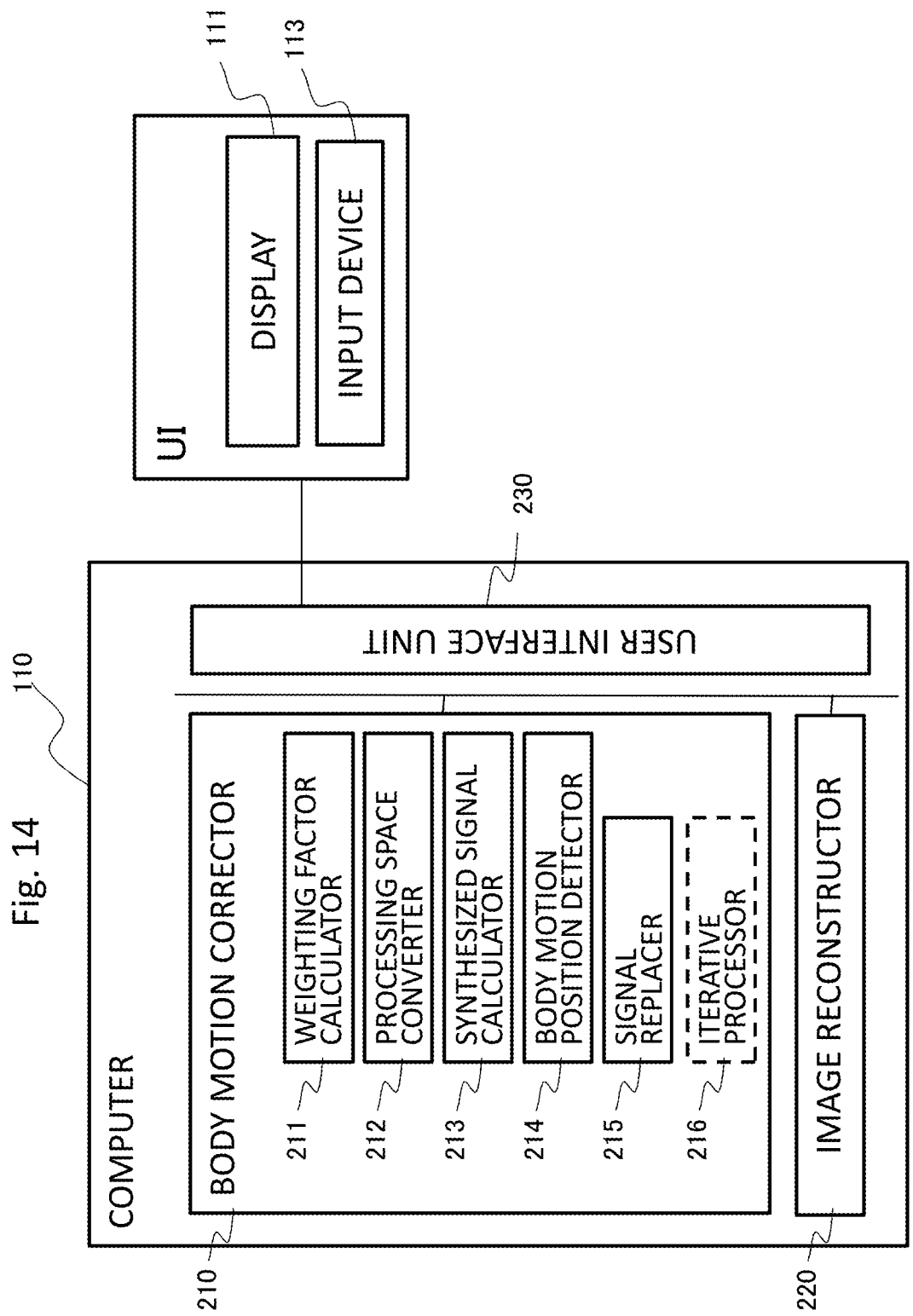
FIG. 14 is a functional block diagram of the signal processing system of the computer of a fourth embodiment.

As shown in FIG. 14, the body motion corrector 210 performs the 3D-kernel calculation (S501), processing space conversion (S502, S503), synthesized signal calculation (S504), body motion detection and signal replacement (S506, S507). Then, the body motion corrector 210 performs one-dimensional inverse Fourier transform on the measurement signal data (hybrid space data) corrected for the body motion by performing the signal replacement to obtain the 3D-k space data, which is then input to the body motion corrector 210 (S508). That is, the 3D-kernel calculator 211 calculates the 3D-kernel using an output (measurement data after the body motion correction) of the signal replacer 215, and the processing space converter 212 converts the measurement data after the body motion correction into the hybrid space. Thereafter, the process of steps S503 to S507 is repeated.

The iterative processor 216 determines an end of repetition. The iterative processor 216 sets an evaluation function (evaluation index) indicating a degree of the body motion in the image before correction, and can complete the repetition when its value is less than or equal to a predetermined threshold value. For example, standard deviations of frequency direction profile of the image before correction are obtained, and sum of the standard deviations in an image end region where the motion artifact occurs is used as the evaluation index. In the end region where no subject is present, the signal value is zero and flat when there is no body motion, but undulation of the signal value due to the motion artifact appears when there is the body motion. Therefore, the presence or absence of the body motion can be determined by using the standard deviation in the end region as the index. Since the body motion usually occurs in a part of all the slices of the image, the threshold value is obtained by multiplying an average value of this value (the standard deviation in the end region) of all the slices by a predetermined coefficient. Then, when the evaluation index (the sum of the standard deviations in the image end region) of each slice after the correction is smaller than the threshold value, the processing is completed.

The determination of the end of the repetition is not limited to the determination using the above-described threshold value. For example, a predetermined number of repetitions may be determined in advance depending on whether priority is given to reducing a processing time or to the accuracy. Further, user's designation may be received for the number of repetitions or the priority of the process.

According to the present embodiment, the accuracy of the body motion correction can be improved by repeating the body motion correction process.

Modification 3

In the first embodiment and the second embodiment, the signal replacer 215 replaces the signal of the line in which the body motion is detected in the measurement signal with the synthesized signal or zero. However, a display for prompting remeasurement may be performed without replacement depending on the degree of the body motion.

In this case, the body motion corrector 210 includes an evaluator (not shown) that evaluates the degree of the body motion. As the degree of the body motion, the evaluation index of the iterative processor 216 in the above-described second embodiment can be used. When the evaluation index exceeds a preset threshold, the body motion correction (signal replacement) is not performed, and the display indicating that the remeasurement is required is displayed on the display or the like. As the threshold value in this case, for example, a value obtained by multiplying the maximum value among the evaluation indexes of all the slices by a predetermined coefficient is used.

Further, when the process is repeated according to Modification 1, if the evaluation index calculated after the n-th process is compared with the evaluation index after the (n+1)-th process and there is no change, the remeasurement may be prompted.

Third Embodiment

The present embodiment is also the same as the first embodiment in that the body motion position detection and the body motion correction are performed in the processing space different from the processing space in which the measurement signal and the 3D-kernel are calculated. However, while the 3D-k space data (first 3D-k space data) used to calculate the 3D-kernel is the 3D-k space data to be corrected for the body motion in the first embodiment, the 3D-k space data obtained by scanning different from the 3D-space data (second 3D-k space data) to be corrected for the body motion is used in the present embodiment. As such 3D-k space data, for example, the measurement data of the same subject, that is, a coil sensitivity map collected for multi-coil sensitivity correction, other prescan data or the like can be used.

Figure 13:
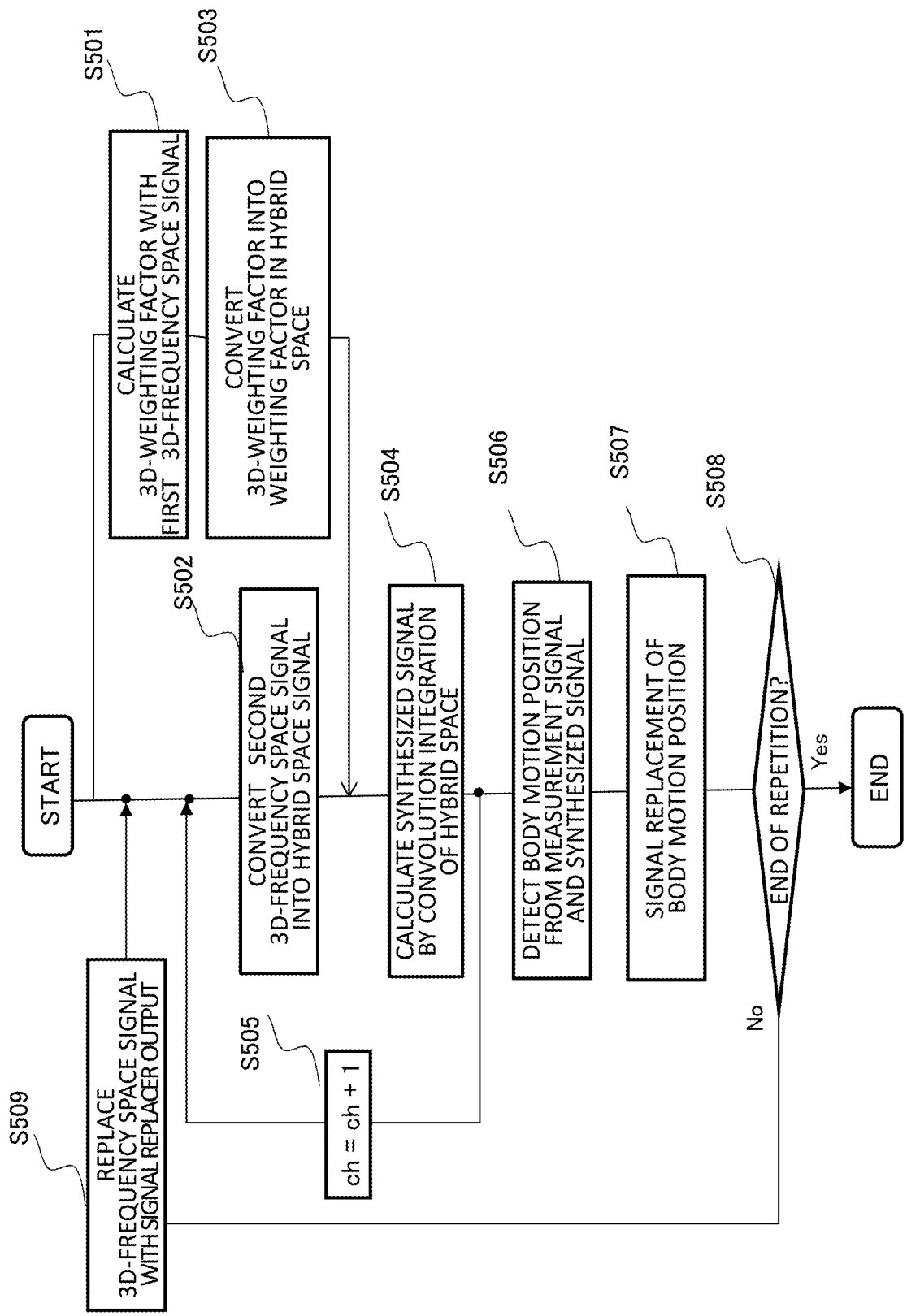
FIG. 13 is a diagram illustrating the processing procedure of the body motion position detection in the body motion corrector of a third embodiment.

FIG. 13 shows the process of the present embodiment. In FIG. 13, the same steps as those shown in FIG. 12 are denoted by the same reference numerals, and the redundant description will be omitted. Although FIG. 13 shows a case where the process is repeated in the same manner as in the second embodiment (FIG. 12), the present embodiment can also be applied to a case where the process is not repeated (FIG. 5). As shown in FIG. 13, the process of steps S501 to S509 is also performed in the present embodiment. However, the process of steps S501 and S503 can be performed using the 3D-k space data (first 3D-k space data) measured in advance, and can be performed separately from a series of steps S502, S504 to S509, for example, in advance.

In the steps S501 and S503, similarly to the first embodiment, the kernel is calculated by solving the above-described equation (2) using, for example, a signal at a certain position and a signal around the certain position. The kernel size is adjusted (zero-filled) corresponding to the matrix of the 3D-k space data to be corrected for the body motion, and the kernel is converted to the 2D kernel.

According to the present invention, the influence of the body motion can be avoided in the kernel calculation by using the data of scanning different from the data to be corrected for the body motion.

Further, according to the present embodiment, since the kernel calculation and the processing space conversion of the kernel can be separated from the body motion correction of the 3D-k space data, the calculation speed of a series of steps for the body motion correction can be further increased. Furthermore, even when the process is repeated as in the second embodiment, high-speed calculation can be performed because the process of the steps S501 and S503 is not included.

Fourth Embodiment

The present embodiment relates to a user interface (UI) for performing the body motion correction of the first to third embodiments.

In the first to third embodiments, it has been described that the body motion corrector receives the 3D-k space data obtained by the imaging unit, calculates the 3D-kernel that is the weighting factor for the data, and detects the body motion position in the hybrid space. However, the accuracy and process time vary depending on conditions such as the size of the 3D-kernel and the number of repetitions of the calculation (for example, the process shown in FIGS. 12 and 13) for calculating the body motion position. In the present embodiment, the computer 110 has an interface for the user to set these conditions.

Figure 15:
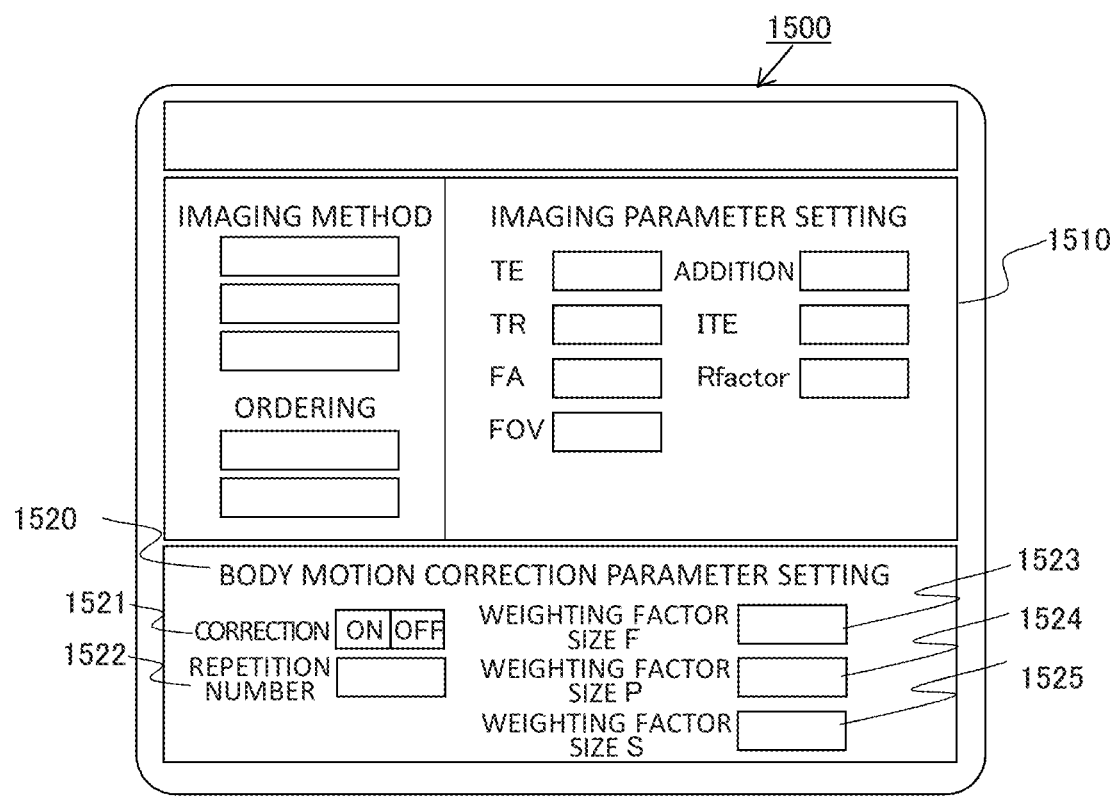
FIG. 15 is a view showing an example of a UI screen according to the fourth embodiment.

FIG. 14 shows a functional block diagram of the computer 110 according to the present embodiment to which a UI function is added, and FIG. 15 shows an example of a display screen for displaying the UI. As shown in FIG. 14, the computer 110 of the present embodiment includes a UI unit 230 in addition to the body motion corrector 210 and the image reconstructor 220. Functions of the body motion corrector 210 and the image reconstructor 220 are the same as those in the first to third embodiments.

The UI unit 230 displays the screen (GUI) for receiving a user's input on the display 111, receives the input of conditions and the like from the input device 113 based on a user operation, and sets the input conditions and the like in the body motion corrector 210. Specifically, as shown in FIG. 15, a setting screen 1500 for the user to set the imaging conditions and the like includes an imaging condition setting unit 1510 for selecting the imaging method and ordering (the scanning method) and setting the imaging parameters in the selected imaging method, and a body motion correction parameter setting unit 1520 for setting parameters for the body motion correction. The imaging condition setting unit 1510 is similar to the setting screen of a general MRI apparatus, but here, user setting of the ordering can be made in consideration of influence of the scanning method particularly on the body motion correction. For example, the interleave measurement as described in Modification 1 of the first embodiment can be designated.

The body motion correction parameter setting unit 1520 includes an ON/OFF button 1521 for selecting whether to perform the body motion correction, an input box 1522 for setting the number of repetitions of the body motion correction calculation, and input boxes 1523 to 1525 for setting the size of the 3D-kernel. For example, in the case of imaging four limbs or a head in which the influence of body motion can be almost ignored, the body motion correction can be turned off and the time from imaging to image display can be reduced.

The accuracy of correction increases as the number of repetitions increases, but the calculation time is longer and S/N deteriorates. Further, as described in the second embodiment, when the number of repetitions is determined based on the index of the body motion, it is difficult to predict the calculation time. However, if the user sets the number of repetitions depending on whether the priority is given to the accuracy or to the time, a degree of freedom of the process increases. As for the kernel size, a recommended value may be set by default, and the user may set the value by checking the image quality. For example, a plurality of processes can be performed with different kernel sizes, and the best result image can be selected.

According to the present embodiment, the conditions for the body motion correction can be set by the user, so that an optimal process can be performed depending on priority items required for the examination. Further, an ex-post analysis can also be performed.

The screen shown in FIG. 15 is an example, and it is not necessary to include all of the GUIs 1521 to 1525 such as buttons and boxes, but it may include a part of them or include the GUIs other than exemplified boxes.

Hereinabove, the embodiments of the nuclear magnetic resonance apparatus of the present invention have been described. However, functions of components, configurations, or calculation methods described as the embodiments of the present invention and the modifications can be combined as long as they do not conflict with each other, and such combinations are also included in the present invention.

What is claimed is:

1. A nuclear magnetic resonance apparatus that generates nuclear magnetic resonance in an inspection object and measures a nuclear magnetic resonance signal, comprising:
    a receive coil that receives the nuclear magnetic resonance signal;
    an image reconstructor that reconstructs an image using a measurement signal received by the receive coil; and
    a body motion corrector that corrects influence of a motion of the inspection object generated in the measurement signal, wherein
    the body motion corrector comprises:
    a weighting factor calculator that calculates a three-dimensional weighting factor based on signals received by multi-channel receive coils constituting the receive coil;
    a processing space converter that converts three-dimensional frequency space data of the measurement signal and the three-dimensional weighting factor respectively into hybrid space data and a two-dimensional weighting factor;
    a synthesized signal calculator that calculates a synthesized signal by convolution integration of the hybrid space data and the two-dimensional weighting factor; and
    a body motion position detector that detects a body motion occurrence position in the hybrid space from the hybrid space data and the synthesized signal.

2. The nuclear magnetic resonance apparatus according to claim 1, wherein
    the body motion corrector further comprises a signal replacer that replaces a signal of the body motion occurrence position detected by the body motion position detector with a signal value at a position corresponding to the synthesized signal, or zero, to correct the signal, and
    the image reconstructor reconstructs the image using the measurement signal corrected by the signal replacer.

3. The nuclear magnetic resonance apparatus according to claim 2, wherein
    the body motion corrector further comprises an iterative processor that repeats a process by at least the synthesized signal calculator, the body motion position detector, and the signal replacer, and
    the body motion corrector repeats the process using the measurement signal replaced by the signal replacer as the measurement signal to be corrected for body motion.

4. The nuclear magnetic resonance apparatus according to claim 1, wherein the weighting factor calculator sets a size of the three-dimensional weighting factor in a direction in which a matrix size of the three-dimensional frequency space data is minimized to 10% or less of size of the three-dimensional frequency space data in the same direction.

5. The nuclear magnetic resonance apparatus according to claim 1, wherein the processing space converter performs a one-dimensional Fourier transform in a direction in which a matrix size of the three-dimensional frequency space data is minimized.

6. The nuclear magnetic resonance apparatus according to claim 1, wherein the processing space converter zero-fills the three-dimensional weighting factor such that a size in a direction in which a size of the three-dimensional weighting factor is minimized is equal to a size of the three-dimensional frequency space data in the same direction, and then performs a one-dimensional Fourier transform in the same direction.

7. The nuclear magnetic resonance apparatus according to claim 1, wherein the body motion position detector calculates a difference between the hybrid space data and the synthesized signal, and sets a position at which the difference or its projection is a local maximum value as the body motion occurrence position.

8. The nuclear magnetic resonance apparatus according to claim 1, wherein the weighting factor calculator calculates the three-dimensional weighting factor using the three-dimensional frequency space data of the measurement signal that is received by the multi-channel receive coils and is different from the measurement signal to be corrected for body motion.

9. The nuclear magnetic resonance apparatus according to claim 1, wherein the weighting factor calculator calculates the three-dimensional weighting factor using the three-dimensional frequency space data of the measurement signal that is received by the multi-channel receive coils and is the same as the measurement signal to be corrected for body motion.

10. The nuclear magnetic resonance apparatus according to claim 1, wherein the three-dimensional frequency space data of the measurement signal is full sampling data that fills an entire frequency space.

11. The nuclear magnetic resonance apparatus according to claim 1, wherein the three-dimensional frequency space data of the measurement signal is undersampling data measured by thinning the frequency space.

12. The nuclear magnetic resonance apparatus according to claim 1, wherein the three-dimensional frequency space data of the measurement signal is data collected in an interleaved manner in a phase encoding direction in a frequency space.

13. A nuclear magnetic resonance apparatus that generates nuclear magnetic resonance in an inspection object and measures a nuclear magnetic resonance signal, comprising:
    a receive coil that receives the nuclear magnetic resonance signal;
    an image reconstructor that reconstructs an image using a measurement signal received by the receive coil;
    a body motion corrector that corrects influence of a motion of the inspection object generated in the measurement signal; and
    a user interface unit that receives a condition on body motion correction, wherein
    the body motion corrector comprises:
    a weighting factor calculator that calculates a three-dimensional weighting factor based on signals received by multi-channel receive coils constituting the receive coil;
    a processing space converter that performs a one-dimensional Fourier transform on three-dimensional frequency space data of the measurement signal received by the multi-channel receive coils and the three-dimensional weighting factor, to convert them respectively into hybrid space data and a two-dimensional weighting factor;
    a synthesized signal calculator that calculates a synthesized signal by convolution integration of the hybrid space data and the two-dimensional weighting factor; and
    a body motion position detector that detects a body motion occurrence position in the hybrid space from the hybrid space data and the synthesized signal, and
    performs a process according to the condition received by the user interface unit.

14. The nuclear magnetic resonance apparatus according to claim 13, wherein
    the user interface unit receives the presence or absence of process of the body motion correction as the condition on the body motion correction, and
    the body motion corrector performs the body motion correction based on the presence or absence of the process of the body motion correction received by the user interface unit.

15. The nuclear magnetic resonance apparatus according to claim 13, wherein
    the user interface unit receives a size of the three-dimensional weighting factor as the condition on the body motion correction, and
    the weighting factor calculator calculates the three-dimensional weighting factor of the size received by the user interface unit.

16. The nuclear magnetic resonance apparatus according to claim 13, wherein
    the user interface unit receives the number of repetitions of the process in the body motion corrector as the condition on the body motion correction, and
    the body motion corrector repeats the process of the body motion correction using the measurement signal after the body motion correction as an initial value according to the number of repetitions received by the user interface unit.

17. A body motion correction method of a measurement signal received by a receive coil included in a nuclear magnetic resonance apparatus, comprising:
    calculating a three-dimensional weighting factor based on signals received by multi-channel receive coils constituting the receive coil,
    performing a one-dimensional Fourier transform on three-dimensional frequency space data of the measurement signal and the three-dimensional weighting factor, to convert them respectively into hybrid space data and a two-dimensional weighting factor,
    calculating a synthesized signal by convolution integration of the hybrid space data and the two-dimensional weighting factor,
    detecting a body motion occurrence position in the hybrid space from the hybrid space data and the synthesized signal, and
    replacing the measurement signal at the body motion occurrence position with a signal value at a position corresponding to the synthesized signal, or zero.

* * * * *